United States Patent [19]

Waldmeier

[11] 4,364,472

[45] Dec. 21, 1982

[54] PACKAGE FOR DIAMONDS AND OTHER PRECIOUS STONES

[75] Inventor: Othmar E. Waldmeier, Basel, Switzerland

[73] Assignee: Elas Trust Reg., Mauren, Switzerland

[21] Appl. No.: 257,164

[22] Filed: Apr. 24, 1981

Related U.S. Application Data

[63] Continuation-in-part of Ser. No. 63,167, Aug. 2, 1979, Pat. No. 4,275,810.

[30] Foreign Application Priority Data

Jun. 1, 1979 [CH] Switzerland .................... 5153/79

[51] Int. Cl.³ .................. B65D 25/54; B65D 61/00; A45C 11/16
[52] U.S. Cl. .............................. 206/45.34; 206/459; 206/216
[58] Field of Search ............... 206/45.34, 45.14, 45.19, 206/526, 0.81, 0.82, 0.83, 0.84, 459, 216

[56] References Cited

U.S. PATENT DOCUMENTS

| | | | |
|---|---|---|---|
| 2,144,336 | 1/1939 | Katz | 206/45.19 |
| 3,139,977 | 7/1964 | Burdick | 206/0.81 |
| 3,406,821 | 10/1968 | Weissberg | 206/526 |
| 3,957,157 | 5/1976 | Therrien | 206/0.83 |
| 4,063,639 | 12/1977 | Grant | 206/0.84 |

FOREIGN PATENT DOCUMENTS

| | | | |
|---|---|---|---|
| 2522101 | 11/1976 | Fed. Rep. of Germany | 206/45.34 |
| 2421818 | 12/1979 | France | 206/45.34 |

*Primary Examiner*—William T. Dixson, Jr.
*Attorney, Agent, or Firm*—Karl F. Ross

[57] ABSTRACT

Diamonds and other precious stones for investment purposes are stored in individual packages which cannot be opened without destruction and which contain, in addition to the precious stone, preferably exposed through a transparent window, various data carriers or information traces which form part of the sealed package. The package can also include optically discernible information as well as information stored in an electronic form, e.g. in a programmable read-only memory (PROM) which can be read upon insertion of the package into an appropriate monitoring device so that information stored in the PROM can be compared with other information, e.g. from a central data bank or information keyed into the device, to determine validity, value or characteristics of the gem.

28 Claims, 8 Drawing Figures

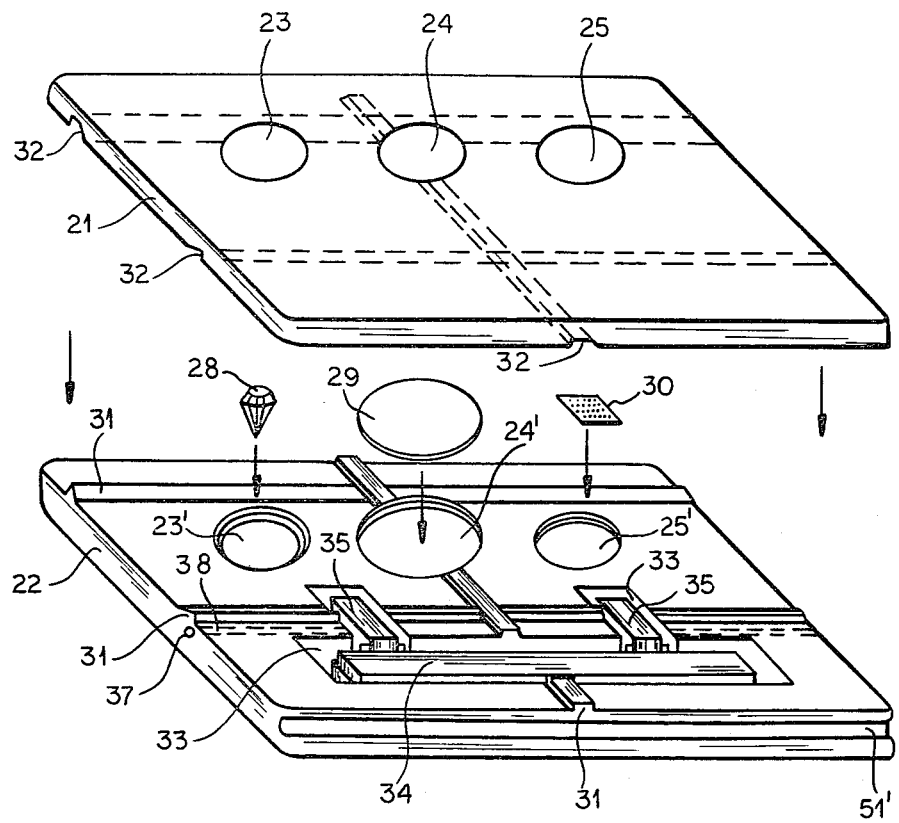
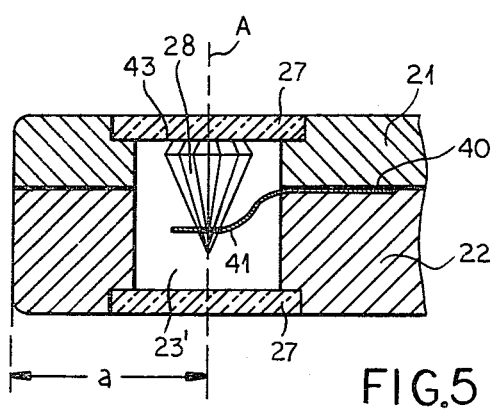
FIG.4
FIG.5

PACKAGE FOR DIAMONDS AND OTHER PRECIOUS STONES

CROSS REFERENCE TO COPENDING APPLICATION

This application is a continuation-in-part of my copending application Ser. No. 063,167 filed Aug. 2, 1979, now U.S. Pat. No. 4,275,810 issued June 30, 1981.

FIELD OF THE INVENTION

The present invention relates to a package for the secure retention of diamonds and other precious stones so as to permit trading in such stones even by non-experts. More particularly, the invention relates to a gem stone package facilitating commerce in gem stones and the conversion of gem stones to currency and other monetary forms.

BACKGROUND OF THE INVENTION

While commercial intercourse in gold and, in general, precious metals is widespread, a similar use of diamonds and other precious stones in commerce has been restricted because of problems intrinsic to precious stones which require an evaluation by experts at each trade, exchange or sale.

Thus diamond speculation is much more limited than speculation in other articles of value and bank, investment organizations and individuals have generally avoided speculation in diamonds without consultation with experts as to the value and characteristics of the stones.

Attempts have been made to overcome the disadvantage that diamonds, unlike coins, are not readily identifiable without experts, by providing the stones in plastic packages and accompanying the stones with certificates as to value, weight and quality. These efforts, however, have not been fully successful in inducing a widespread trade involving non-experts. While certificates and packages of the aforedescribed type are useful in trades involving honest individuals on all sides, this cannot be guaranteed.

Both American and German institutions have established precise guidelines for the determination of diamond values and these rules have been applied in the diamond trade but have not increased the possibility of individual investment in diamonds because of the uncertainty which accompanies any handling of items which are not readily identifiable as to quality, weight and value.

Gold, coins and like investment-grade articles can be purchased from banks, have a daily ascertainable value and can be converted widely and at practically any time into currency or other forms of investment or value in unrestricted commercial intercourse because of the identifiability of the items.

Diamonds, however, do not have this advantage although a market value can generally be ascertained for a particular quality and size of the gem stone.

Banks and investors require security, identifiability and convertibility, three characteristics which, without the intervention of experts, have not been fulfilled to date by precious stones.

Relevant prior art includes Swiss Pat. No. 568,201, U.S. Pat. Nos. 2,144,336, 3,406,821, 4,063,639 and 3,957,157 and German patent document No. 2,552,101.

OBJECTS OF THE INVENTION

It is the principal object of the present invention to provide a secure package for diamonds and other precious stones which will allow safe trading of the stones without the disadvantages enumerated above, e.g. in a manner similar to the present day trading in gold coins.

Another object of the invention is to provide a package for diamonds and like precious stones which will afford an absolutely safe, nonforgeable identification of the contents.

Yet a further object of this invention is to extend the principles originally set forth in the above-identified copending application.

SUMMARY OF THE INVENTION

These objects and others which will become apparent hereinafter are attained, in accordance with the present invention, in a package for a precious stone which comprises a two-part core of transparent material, the two parts of which fit together and together define two cavities or spaces, one of which serves to receive a precious stone such as a diamond while the other receives a data carrier, such as a microfilm, bearing all of the information necessary for complete identification of the stone. The two halves of the core are held together by a body which is not readily destructible but, if treated, so as to enable separation of the two parts of the core, provides visible evidence of the separation.

According to a feature of the invention, the body surrounding the core consists of two hard-metal rings which are connected inseparably with one another, e.g. by a screw thread designed so that when the rings are tightened together to clamp the two parts of the core, they undergo cold welding to form the inseparable bond.

According to another feature of the invention one of the hard-metal rings, in the region of the interface or junction between them is formed with an annular groove receiving a sound-recording material which can be provided with information matching the information of the data carrier and confidential informations characteristic of the preparer of the package so that a fraudulent package can be readily discovered upon monitoring of the information on the completely concealed acoustic recording medium. Furthermore, the acoustic recording medium can be held in the groove so that any separation of the two rings will disturb the material and destroy or disturb the information recorded therein.

According to another feature of the invention, one or both of the hard-metal rings can be provided with an electronic control circuit with terminals which can be connected to a monitoring or reading device so that the circuit can provide indicia of the contents or information matching that on the data carrier and/or the sound-recording medium. The electronic circuit can, for example, be an oscillator generating a characteristic frequency ascertainable upon connection to the terminals or, for example, a microcomputer or ROM storing a large number of bits as indicia which facilitate identification.

Yet another feature of the present invention resides in providing the aforementioned body, e.g. one or both of the rings, with an indexing recess or with indexing recesses in a control device, i.e. a system for reading the stored information. The two-part core can consist of sapphire glass and can define an annular groove between the parts which can receive a silicone sealing ring hermitically sealing the two spaces. The hollow space for receiving the stone is advantageously conical while the monitoring contacts or terminals for the electronic circuit are preferably gold contacts set into sapphire to minimize wear even with repeated monitoring of the package. Naturally one of the hard-metal rings can also be engraved with the information required to identify the stone so that the identification will be readily apparent to any individual having possession of the package.

More generally, the invention can be considered to comprise a package having two interconnected rigid parts which are separable only by damage to the package and forming a chamber in which the diamond or other gem stone can be positioned, preferably so as to be visible through a window in the manner described, the package formed by the two parts also including at least one data carrier and preferably at least three separate data carriers including an optically discernible data carrier such as the aforementioned microfilm which can include a gem print and other information regarding the quality standards of the stone such as its weight in karats, its color, its cut and its clarity, as well as historical or source data if desired. The second data carrier stores information in the form of electronically readable data, e.g. in the form of a magnetic strip or a frequency modulated trace otherwise applied to the package material itself or an enclosure in the package, or a programmable read only memory which is preprogrammed with the data associated with the stone and other data for verifying the validity of the package and its contents. Naturally both the magnetic or frequency modulated trace and a PROM can be provided.

The third data carrier may be mechanically monitored and can be a characteristic shape, texture or like information-generated structure on the package itself.

According to the invention, the package which can be of the circular configuration previously described or of a polygonal configuration e.g. rectangular, can include contacts with the PROM and are utilized when the preprogrammed data is to be read.

The invention also comprises a system for monitoring the validity of the package and can include a unit into which the package can be inserted for connection of a microprocessor or other central processing unit, keyboard and display to the package whereby, for example, a stored data in the PROM can be read out on the display, the integrity of the package can be displayed, a code number or word keyed into the unit for comparison with data stored in the PROM, and calculations can be made as to current value, etc.

The package comprises a destructible seal which, upon separation of the two parts, invariably is broken and hence serves as a demonstration of integrity while this seal is intact. The seal may be visible through an appropriate window in the package.

Advantageously, the package comprises three windows, through one of which the diamond or other gem stone is visible while the other two windows serve to display the seal and gem print, respectively.

According to yet another feature of the invention, the package is provided with means for removably affixing an information strip thereto so that the owner of the package can store the strip separately from the package and thereby render it more difficult for a thief to convert the package should he somehow come into possession of it. According to the invention, the monitoring unit is provided with means for reading the strip and comparing the information stored thereon with information stored on the PROM or the other data carriers of the package.

BRIEF DESCRIPTION OF THE DRAWING

The above and other objects, features and advantages of the invention will become more readily apparent from the following description, reference being made to the accompanying drawing in which:

FIG. 4 is an exploded view of another diamond package in accordance with the invention, also in somewhat diagrammatic form;

FIG. 5 is a detail view, in axial cross section showing the diamond chamber and the diamond mounting for the package of FIG. 4;

SPECIFIC DESCRIPTION

Figure 1:
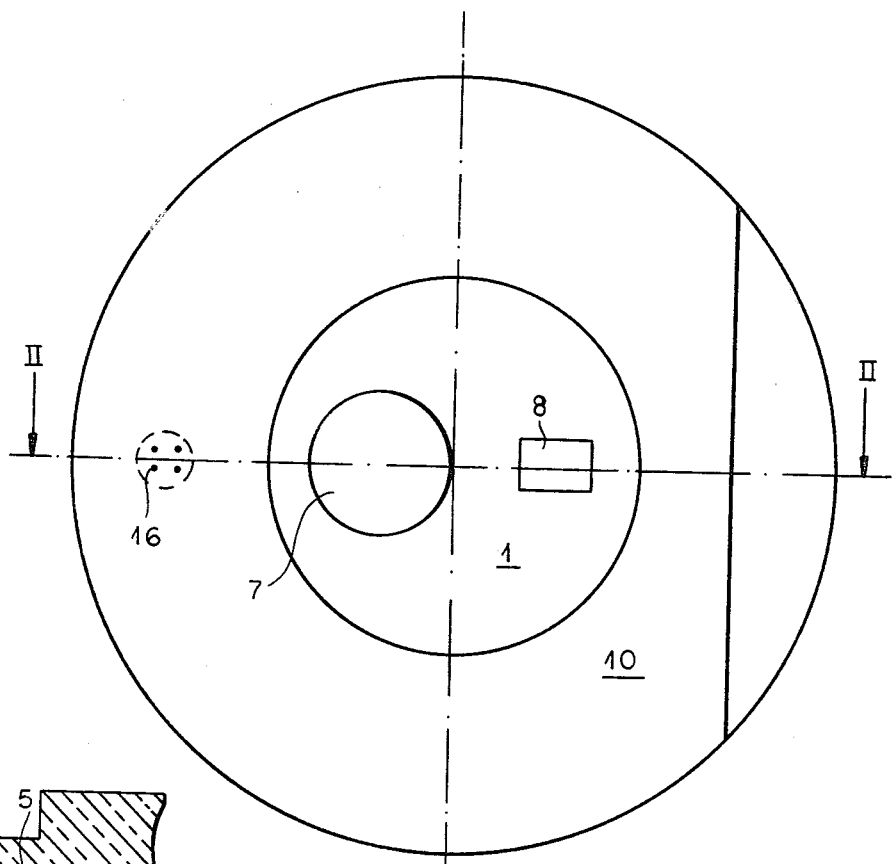
FIG. 1 is a plan view of the package according to the present invention.
Figure 3:
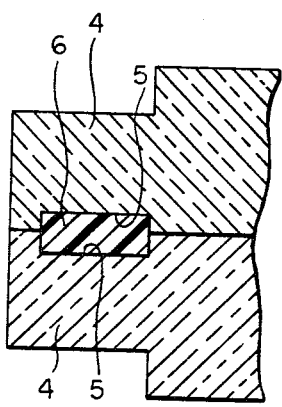
FIG. 3 is a detail view of a portion of the core.

As can be seen from the drawing, the package basically comprises a core of transparent material in which a precious stone and a data carrier can be received and a body which surrounds this core and holds the parts thereof together, this body being composed of a material which is difficult to destroy.

The core 1 comprises two disks 2, 3, composed of sapphire glass, each disk having annular lips 4 which are provided with precisely registering annular grooves 5 together defining a space 5' for the silicone sealing ring 6.

Figure 2:
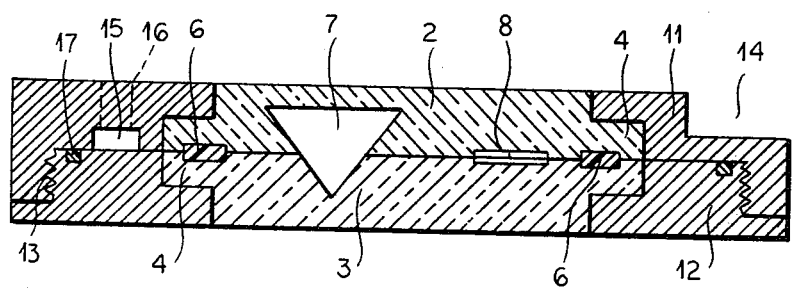
FIG. 2 is a cross sectional view taken along the line II—II of FIG. 1.

The two disks, when pressed together as shown in FIG. 2, define a conical space 7 forming a hermetically sealed chamber adapted to receive the diamond or other precious stone. The second space 8 receives a data carrier which contains all of the information required to identify the stone enclosed in the core.

Advantageously, the data carrier is a microfilm which carries information such as a description of the stone including its weight, its color, its brilliance, other indicia of quality, its polish and cut and a gem print or other, "fingerprint" identification of the stone. Any commercial quality indicia, data as to source may also be provided.

It is advantageous to provide gem prints of the type developed by S. Shtrikman, the Israeli physicist, using an apparatus of the type manufactured by Kulso Ltd. whereby a helium-neon laser projects a beam through a facet of the diamond with the light being reflected at various angles. The result is an image of points which can be recorded as an instantaneous image by a camera. This image has been found to be as characteristic of a diamond as a fingerprint is of an individual and hence may be included as the sole identifying data or as a portion thereof.

Naturally, an electronic or other optical data carrier can be provided in the space 8, preferably carrying the same information as has been enumerated above.

The part 10 of material which is difficult to destroy comprises two hard-metal rings 11 and 12 which are screwed together. The core 1 is gripped by inwardly extending flanges of the rings 11 and 12 overhanging the lips 4 mentioned previously. The permanent bond is formed by a low-pitch screw thread 13 with two rings tightened together until cold welding occurs in the region of the thread thereby preventing the ring from being separated. Naturally, neither means can be used to secure the rings permanently together in addition to or separate from the cold welding or from one another, e.g. depositing or fusion welding, cementing or hard soldering.

The rings 11 and 12 contain additional information in storage means and control devices which are intended primarily for the dealers distributing or dealing in the packaged stones although the information may also be convenient for the purchaser. To read out the information for control purposes or to change or initially supply the information, peripheral equipment is required which does not form part of the invention and, apart from its application to the packages of the present invention, is conventional. The upper ring 11 has a recess 14 which serves to index the package in a peripheral apparatus for read out or data insertion. Naturally, recesses can be provided on either or both rings.

Of course, the dimensions of the recess can be varied to provide some indication of the contents of the package, e.g. the type of gem stone.

An integrated electronic circuit 15 is mounted in the upper ring 11 and is connectible by terminals 16 therein to the peripheral equipment. An appropriate circuit can be an oscillator whose frequency must correspond to a coded frequency on the microfilm. The recess 14 guarantees the exact positioning of the package in the peripheral for determining the frequency.

Instead of a simple frequency-selection circuit, member 15 can represent a microcomputer or a memory or storage, usually a PROM, several thousand bits of information can be stored and which can be read via the terminals 16. To increase the useful life of the terminals, they can comprise gold pins which are mounted in a sapphire support. Optimum physical and electronic characteristics and higher long life insulation between terminals is therefore assured.

The lower ring 12 is provided in the region of the thread 13, with an annular groove 17 into which iron oxide is placed to act as a sound-storage medium. It has been found that a storage ring can retain up to 40 thousand bits of information which can be related to the purchase site or other confidential or internal bank data which, when tampered with or not present, can signal a forgery. Naturally this ring of sound recording material can carry coded information which must correspond to data on the microfilm. Security with the package of the present invention is thus guaranteed in a manifold manner.

The precious stone is fully protected and replacement of the stone can only occur by destroying the body. Destruction of the body will, however, destroy various data carriers or coded information and hence the replacement will be readily signaled.

Control of the data carrier requires special peripherals without which the coded data cannot be read and hence falsification of the package is exceptionally expensive and will require confidential bank information not readily accessible to an outsider.

Furthermore, it is possible to conceive of a computer with terminals at all of the diamond markets or brokerage sites so that each purchaser of each diamond will be centrally identified and the information stored at the diamond center.

The buyer, without special means, can readily see what he has purchased and can identify it from engraving on the lower ring 12 which can identify the nature of the stone, the color and the weight.

In FIGS. 4 and 5 I have shown a security package of rectangular configuration which comprises a pair of plates 21 and 22 composed of an oxide ceramic (e.g. $Al_2O_3$) and which can be bonded together so that access to the interior of the package is precluded except by breaking the package or drilling out the gem stone.

In the closed condition of the package (FIG. 5) the two coextensive plates 21 and 22 are joined together so that their bores 23 and 23', 24 and 24' and 25 and 25' are aligned to define chambers for the gem stone, have a seal and form the gem print or microfilm data carrier, respectively.

Each of the chambers thus defined is provided with a recess at each end as shown in FIG. 5 in which sapphire glass window disks 27 can be fused.

In the chamber formed by the bores 23 and 23', the gem stone 28, usually a diamond (shown in a brilliant cut) is seated in an opening 41 of a leaf spring 40 which holds the diamond against the upper window 27 under slight pressure, the leaf spring 40 being locked between the upper and lower members 21 and 22 of the package.

The seal 29 of the Gemological Institute is pointed to the two parts of the package and is disposed in line with the bores 24 and 24', this institute having issued the certificate for the stone 28. This seal is a coin-like metal foil which has on one side the sign of the testing laboratory and on the opposite side can be embossed with indicia relating to the stone so that such indicia can be read without magnification or translumination.

The gem print and other data contained on the microfilm 30, which can represent a photographically reduced test certificate for the stone, is received in the chamber formed by the bores 25 and 25' and can be transluminated and enlarged while in place.

When direct fusion of the two plates 21 and 22 is not possible, the plates can be bonded at their mutually contracting surfaces by a two-component epoxy resin such as araldit manufactured by CIBA Geigy AG Basel, Switzerland. To prevent separation in this case, the upper plate may be provided with V-shaped or trapezoidal grooves 32 while the lower plate has complementary ridges 31 so that the two plates are effectively interlocked and the upper plate weakened so that any attempt to separate the two plates will apply such stress to the upper plate that it will crack before it is released by the epoxy resin.

The package is formed with recesses 33 to receive the integrated circuit elements 35 forming part of a PROM 34 which has contacts 37 extending through bores 38 for electrical connection to the PROM.

Since the mounting arrangement shown in FIG. 5 positions the axis A of the stone 28 at a precise distance a from an edge of the package, the stone itself can be monitored by an optical of x-ray scanner in a peripheral unit if desired.

Figure 6:
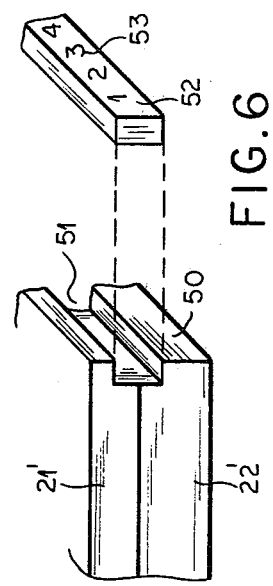
FIG. 6 illustrates the relationship of a removable data strip to the package in diagrammatic perspective form.

As can be seen from FIG. 6, the longitudinal edge 50 of the package can be provided with a groove 51, e.g. a so-called identification groove having the function of the recess 14 of the package previously described. In the embodiment of FIG. 6 the groove 51 is formed by the two plates 21' and 22' where they join whereas the groove 51' in FIG. 4 is formed exclusively in the lower plate 22. The shape, position and width of this groove can provide information of the type described for the mechanically sensed data relating to the stone.

According to the invention, this identification groove 51 can receive an identification strip 52 which can be provided with a visible or concealed identification or serial number (adapted to be matched with that engraved on one of the package members) and which may also have a magnetic or other information trace readable by the monitoring unit, e.g. to display the number.

When the package is received by the investor, he may remove this strip and store it separately from the package, thereby rendering the package less valuable or convertible to a potential thief. Of course, when the package is to be marketed through a legitimate dealer or institution, it must be accompanied by the strip 52.

Figure 7:
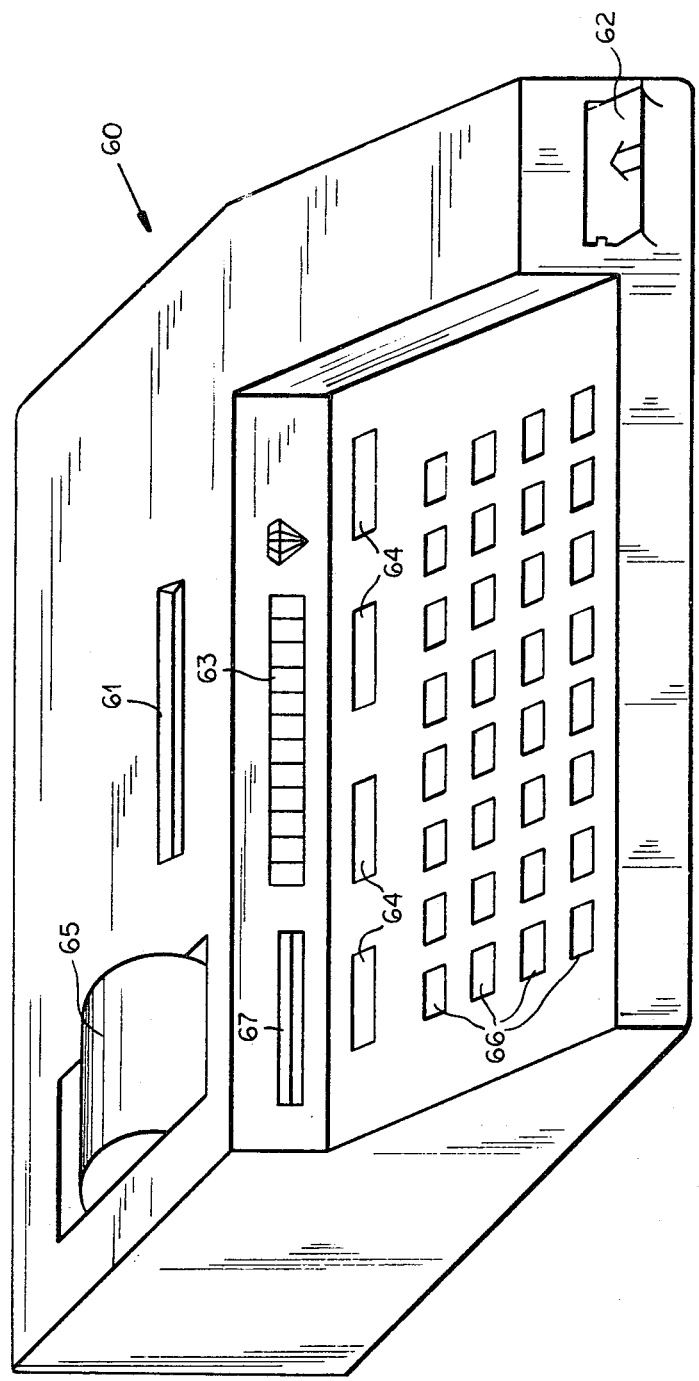
FIG. 7 is a perspective view showing a monitoring unit which can be used in accordance with the invention.

In FIG. 7 I have shown the monitoring unit 60 in highly diagrammatic form.

When the investor wishes to obtain the current value of his stone or to seal or exchange the latter, he brings the intact package to an appropriate institution provided with unit 60 together with the identification strip in place in the groove 51 or 51'.

At the monitoring station, the identification strip is removed and inserted in groove 61 while the package is fed through opening 62 into the unit which provides an alphanumeric display 63 of the identification number from the strip which is compared with the identification number stored in the PROM or on the other electronic trace of the package.

The device reads the data stored in the PROM and can illuminate one or more of the display fields 64 to indicate the status of the stone.

Specific data relevant to the stone contained in the PROM 34 are printed out at the paper tape 65 and can be displayed on the alphanumeric display 63.

Internal information necessary for handling of the stone, e.g. account numbers, current value or the like, can be introduced by a keyboard 66 which can also call up a central data bank to compare information from the PROM with centrally stored information, e.g. relating to possible theft reports.

Depending upon daily market fluctuations and the values from PROM recorded factors such as the type of stone, size, color, cut, clarity and absence of defects, the unit then calculates the current value which can be printed out on the tape issued through the slit 67.

It will be apparent that only in the most suspicious or unusual cases will it be necessary to provide an optical peripheral unit for reading the microfilm or subjecting the stone to evaluation by a laser beam and comparing the result with the gem print.

Figure 8:
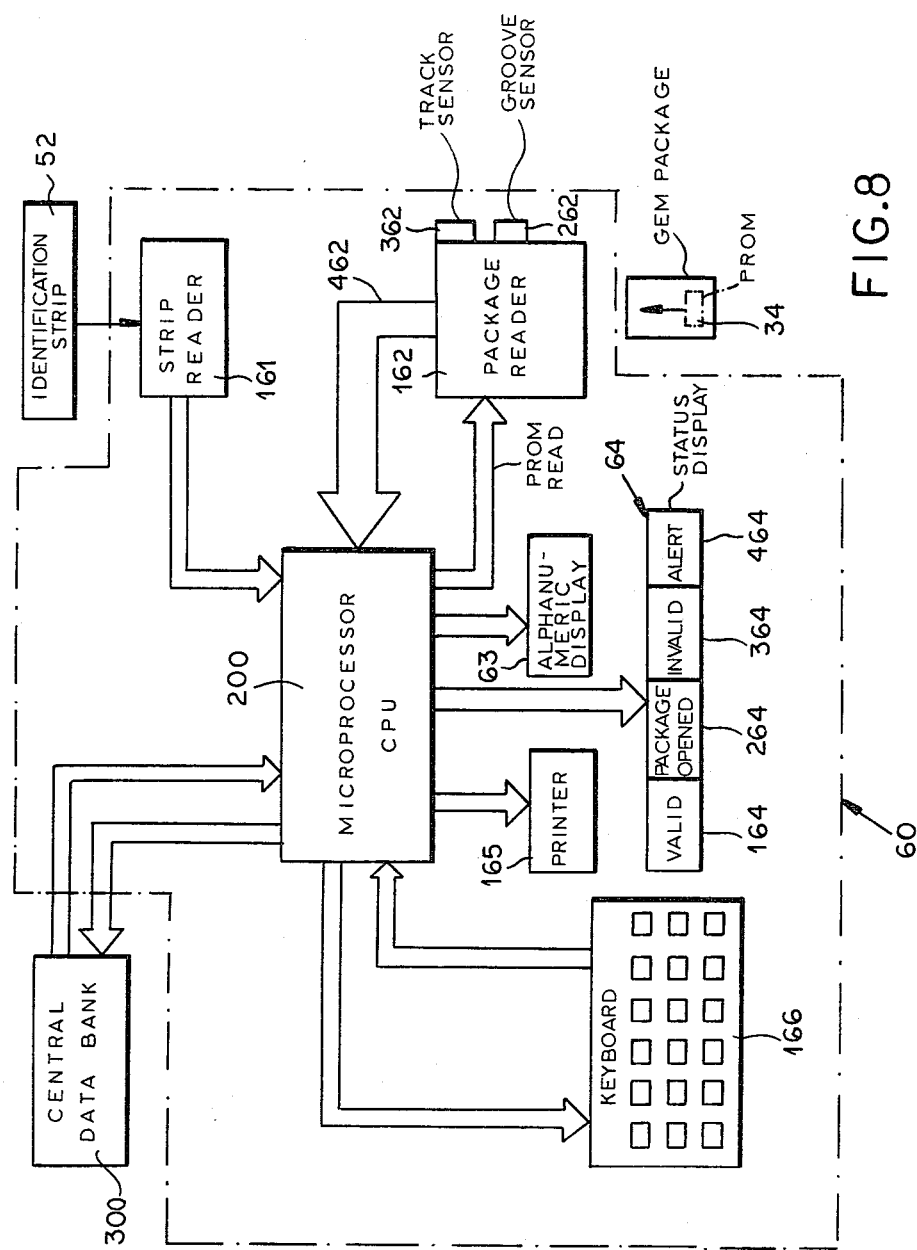
FIG. 8 is a block information flow diagram for the unit of FIG. 7.

FIG. 8 shows the information flow process of this unit, and the unit will thus be seen to include a strip reader 161 capable of reading the information on the magnetic trace of the strip 52 and feeding this information to microprocessor central processing unit 200 which supplies the signal to the PROM reader 162 into which the package is inserted. This reader can also have a groove sensor 262 for determining the validity of the package from the width of groove 51 and a sensor 362 for any other information magnetically or otherwise recorded on the package directly. This information is delivered at 462 to the CPU 200.

The CPU 200 controlled by the keyboard 166 can feed data to or call up data from the central bank 300 and activates the printer 165 for the paper tape, the alphanumeric display 63 and the status display 64 in the manner described. The status display 64 can have any desired mode of displaying status. For example, it can illuminate a "valid" field 164 if all of the data as compared is consistent, a "package opened" field 264 should the sensors detect that the package has been altered or changed in any manner, an "invalid" field 364 if there is an inconsistency in data, or an "alert" field 464 if, for example, the data indicates that the package has been stolen or is not being presented by its rightful owner.

The data stored in the PROM 34 can include a code word or number which, known only to the owner of the package, can be keyed in for monitoring so that a comparison will show validity. The circuitry of unit 60 can, of course, include amplifiers for the coded information signals.

I claim:
1. A secure package for a precious stone comprising:
   two substantially coextensive rigid members secured together and formed with respective throughgoing bores defining a compartment for a precious stone and secured together so as to prevent opening of the package without noticeable damage thereto;
   respective rigid windows fixed in said members and enabling viewing of said stone within said compartment; and
   at least one data carrier received in said package and provided with externally monitorable coded information relating to the stone in said compartment.
2. The package defined in claim 1 wherein said members are round.
3. The package defined in claim 1 wherein said members are polygonal.
4. The package defined in claim 3 wherein said members are generally rectangular frangible plates.
5. The package defined in claim 1, claim 2, claim 3 or claim 4 wherein said members are composed of an oxide ceramic.
6. The package defined in claim 5 wherein said members are provided with mutually complementary interfitting formations in a formfitting relationship.
7. The package defined in claim 5 wherein said members are bonded together with an adhesive.
8. The package defined in claim 1, claim 2, claim 3 or claim 4 wherein said data carrier comprises a programmable read-only memory and said package is formed with contacts enabling said package to be connected to an external monitoring unit capable of reading the information contained in said programmable read-only memory.
9. The package defined in claim 8 wherein at least one of said members is provided with magnetically recorded information relating to said stone.
10. The package defined in claim 1, claim 2, claim 3 or claim 4, further comprising a microfilm viewable through a window in at least one of said members and containing photographically recorded data relating to said stone.
11. The package defined in claim 3 wherein said members are each provided with at least one further bore, the further bores of said being aligned, said package including a seal of an institution verifying the quality of said stone fixed between said members and viewable through said further bores.
12. The package defined in claim 1, claim 2, claim 3 or claim 4, further comprising a groove formed in at least one of said members, and an electronically readable information strip received in said groove but separable therefrom and containing coded information relating to said stone.

13. The package defined in claim 1, claim 2, claim 3 or claim 4, further comprising engraved information on at least one of said members relating to said stone.

14. The package defined in claim 1, claim 2, claim 3 or claim 4 wherein said windows are formed from sapphire glass.

15. The package defined in claim 1, claim 2, claim 3 or claim 4, further comprising a retaining spring extending into said compartment and forming a seat for said stone while resiliently pressing same against one of said windows.

16. The package defined in claim 1, claim 2, claim 3 or claim 4 wherein at least one of said members has a frequency modulated sensible trace engraved thereon for identification purposes.

17. The package defined in claim 1, claim 2, claim 3 or claim 4 wherein said members are provided with outwardly open recesses around said bore receiving said windows flush with outer surfaces of said members.

18. A gemstone control system comprising:
a gemstone package including:
two coextensive rigid members secured together so as to prevent separation of said members without noticeable damage to said package, said members defining at least one compartment,
means for mounting a precious stone in said compartment,
transparent means forming rigid windows on opposite sides of said compartment for enabling said stone to be viewed therein, and
an electronically readable data carrier on said package containing coded information relating to the stone in said compartment; and
an electronic monitoring unit comprising:
means for receiving said package and automatically reading said coded information,
means for displaying the information read from said data carrier, and
means for correlating the information read from said carrier with additional information inputted into said unit.

19. The system defined in claim 18 wherein the correlating means indludes a keyboard on said unit for inputting data thereto.

20. The system defined in claim 18 wherein the displaying means includes a printer in said unit for generating a printout of information inputted into into said unit and read from said data carrier.

21. The system defined in claim 18 wherein said displaying means includes illuminatable display fields in said unit selectively illuminated in accordance with the status of said package.

22. The system defined in claim 18 wherein said correlating means includes means for calling up data from a central data bank.

23. The system defined in claim 18 wherein said package is provided with a groove and an information carrier received in said groove but separable therefrom and containing electronically readable coded information, said unit further comprising means for receiving said strip and electronically reading the coded information thereof.

24. The system defined in claim 18, claim 19, claim 20, claim 21, claim 22 or claim 23 wherein said data carrier is a programmable read-only memory received in said package and said package includes contacts connectable with said means for reading.

25. The system defined in claim 24 wherein said members are generally rectangular frangible oxyceramic plates bonded together with an adhesive and formed with sapphire glass windows enabling said stone to be viewed therethrough, said plates being formed with aligned bores enabling a seal of a validating institution and a microfilm containing data to be viewed through said bores.

26. The system defined in claim 18, claim 19, claim 20, claim 21 or claim 22 wherein said members are interconnected metal rings, said windows being formed by a glass core forming said compartment and anchored in said rings.

27. The system defined in claim 18 wherein said package is circular and flat.

28. The system defined in claim 18 wherein said package is flat and generally rectangular.

* * * * *